US006737355B2

(12) United States Patent
Gross

(10) Patent No.: US 6,737,355 B2
(45) Date of Patent: May 18, 2004

(54) THICK THERMAL OXIDE LAYERS AND ISOLATION REGIONS IN A SILICON-CONTAINING SUBSTRATE FOR HIGH VOLTAGE APPLICATIONS

(75) Inventor: Harald S. Gross, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 67 days.

(21) Appl. No.: 10/006,306

(22) Filed: Dec. 6, 2001

(65) Prior Publication Data
US 2003/0109122 A1 Jun. 12, 2003

(51) Int. Cl.[7] ............................................ H01L 21/302
(52) U.S. Cl. ...................... 438/689; 438/694; 438/700; 438/704; 438/719; 438/723
(58) Field of Search ................... 438/689, 694, 438/700, 704, 719, 723, 710, 750

(56) References Cited

U.S. PATENT DOCUMENTS

| 5,189,501 A | | 2/1993 | Kawamura et al. |
| 5,386,142 A | | 1/1995 | Kurtz et al. |
| 5,410,176 A | | 4/1995 | Liou et al. |
| 5,863,826 A | | 1/1999 | Wu et al. |
| 6,084,257 A | * | 7/2000 | Petersen et al. ............. 257/254 |
| 6,099,744 A | | 8/2000 | Advena et al. |
| 6,146,970 A | * | 11/2000 | Witek et al. ................. 438/424 |
| 6,197,658 B1 | * | 3/2001 | Jang ............................ 438/424 |
| 6,338,284 B1 | * | 1/2002 | Najafi et al. ................ 73/866.1 |
| 6,355,540 B2 | * | 3/2002 | Wu .............................. 438/433 |

FOREIGN PATENT DOCUMENTS

EP 1113492 7/2001

* cited by examiner

Primary Examiner—Robert Kunemund
Assistant Examiner—Binh X. Tran
(74) Attorney, Agent, or Firm—Shirley L. Church

(57) ABSTRACT

Disclosed is a method of forming a thick silicon oxide layer upon or internal to a silicon structure. The method is particularly useful in creating isolation regions within a silicon-containing structure, where such isolation regions can withstand high voltages. The electrically isolating thick silicon oxide layer or isolation regions can be shaped, machined, or etched to provide feedthroughs for vertical or horizontal interconnects. The feedthroughs may be coated with metal or filled with metal to provide the interconnect.

30 Claims, 11 Drawing Sheets

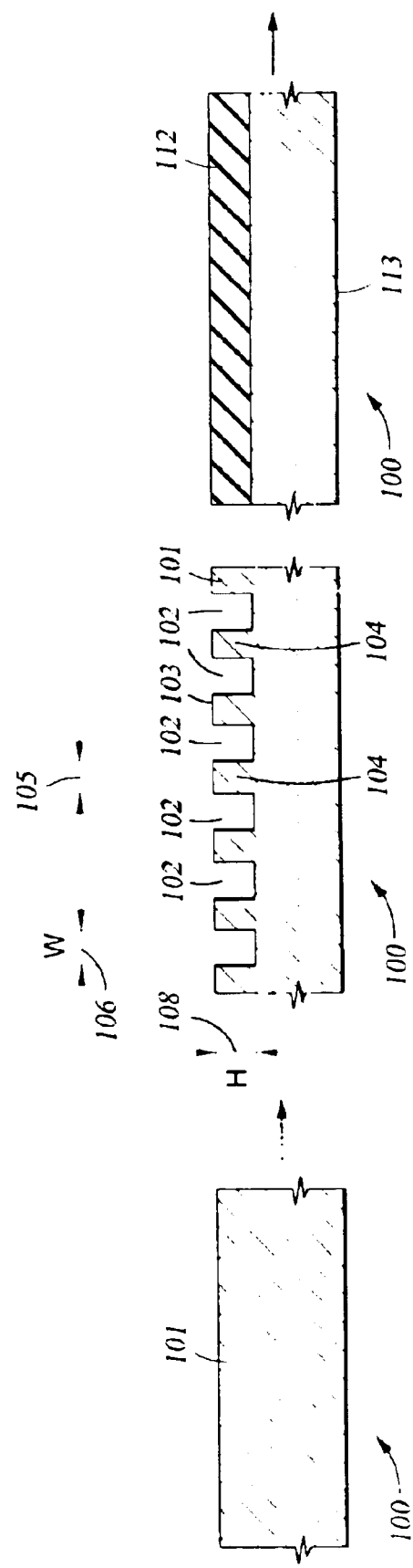

THICK THERMAL OXIDE LAYERS AND ISOLATION REGIONS IN A SILICON-CONTAINING SUBSTRATE FOR HIGH VOLTAGE APPLICATIONS

FIELD OF THE INVENTION

In general, the present invention relates to a method creating thick thermal oxide layers on silicon. Also, the present invention relates to a method of separating high voltage areas within a silicon chip, wafer, or stack of silicon chips, or stack of silicon wafers. The present invention also relates to a method of integrating and connecting vertical feedthroughs in a stack of silicon layers.

BRIEF DESCRIPTION OF THE BACKGROUND ART

Various processes have been developed to create isolation regions in silicon. One of the popular methods of creating isolation regions within a silicon substrate is through thermal oxidation of areas of silicon itself. For example, in U.S. Pat. No. 5,410,176 to Liou et al., issued Apr. 25, 1995, the inventors describe a method for forming isolation structures in an integrated circuit. First step is masking all the active regions on the silicon. After masking recesses are etched into the exposed silicon to a depth on the order of the final thickness of the insulating isolation structure. Sidewall spacers of silicon dioxide, or another insulating amorphous material are disposed along the side walls of the recess, with silicon at the bottom of the recesses exposed. Selective epitaxial growth of silicon is then used to form a layer of silicon within the recesses, preferably to a thickness on the order of half of the depth of the recess. The epitaxial silicon is thermally oxidized, filling the recesses with thermal silicon dioxide, having a top surface which is substantially coplanar with the active regions of the surface.

In U.S. Pat. No. 5,863,826 to Wu et al., issued Jan. 26, 1999, the inventors disclose a method for forming field isolation regions in multilayer semiconductor devices comprising the steps of masking active regions of the substrate, forming porous silicon in the exposed field isolation regions, removing the mask, and oxidizing the substrate. A light ion impurity implant is used to create pores in the substrate. Substrate oxidation proceeds by rapid thermal annealing because the increased surface area of the pores and the high reactivity of unsaturated bonds on these surfaces provides for enhanced oxidation.

In U.S. Pat. No. 5,189,501 to Kawamura et al., issued Feb. 23, 1993, the inventors describe an isolator for isolating semiconductor devices, components of an integrated circuit, on a semiconductor substrate, wherein the isolator is delimited by walls of a trench formed on a top surface of the semiconductor substrate, where the trench filled with a silicon oxide layer deposited by a chemical vapor deposition method. A small ditch created in the middle of a top surface of the silicon oxide layer in the trench is filled with silicon, and at least a top surface of the silicon is thermally oxidized to form another silicon oxide layer.

In U.S. Pat. No. 5,386,142 to Kurtz et al., issued Jan. 31, 1995, the inventors describe a semiconductor structure having environmentally isolated circuit elements disposed thereon. The semiconductor structure has a first semiconductor wafer having a semiconductor element such as a piezoresistive element or any integrated circuit located on a top surface thereof. The first wafer is bonded to a second semiconductor wafer so that the semiconductor element on the first wafer is received in a cavity sealed from the outside environment. The bottom surface of the second wafer is prepared by etching it about a mask pattern so that the pattern projects from the bottom surface, thereby forming a cavity and defining projecting surfaces which are bonded to corresponding projecting areas on the first wafer to create a hermetic seal there between. The second wafer is electrochemically etched to produce porous silicon with regions of non-porous monocrystalline silicon extending between the top and bottom surfaces. The porous areas are thermally oxidized to convert them to silicon dioxide while the non-porous regions bonded to bond pads of the resistive pattern on the first wafer act as extended contacts.

Applicants' review of the background art in general has indicated that in order to handle high voltages the silicon oxide layer needs to be thick. Two micron of silicon oxide layer thickness is needed to handle a voltage of about 1 kV. In order to handle a voltage of 3–5 kV, the silicon oxide layer thickness should be in the range of 6–10 $\mu$m. Generally a thickness of 3 $\mu$m silicon oxide layers can be formed by long wet thermal oxidation. However 3 $\mu$m thickness is not sufficient to handle a voltage of 3–5 kV reliably since pinholes and other artefacts in the oxide can lower the breakdown voltage.

In the field of semiconductor device fabrication, particularly with the continuing trend toward smaller device feature sizes, micromachining technology compatible with semiconductor processing is a necessity. Microcolumns which are miniaturized electron optic devices facilitate smaller device fabrication. Generally, microcolumns are made of pyrex and silicon. But, pyrex can not be machined with as high a precision as silicon. Therefore, it would be advantageous to find a method enabling fabrication of microcolumns out of silicon alone. However to handle high voltages, portions of the silicon need to be converted to silicon oxide which has a thickness in the range of 6–10 $\mu$m. As stated above, with the general methods available today a silicon oxide thickness which can be generated within a reasonable time by wet thermal oxidation is about 3 $\mu$m (which is generated in about approximately 18 hours at a temperature of 1100° C.).

Often, isolation regions are created within silicon structures for various purposes, for example, to often protect circuit elements within one region from interfering with the functions of circuit elements in another region. Some of these isolation regions need to provide insulation from high voltages. In order to accomplish high voltage insulation, it would be useful to be able to partition silicon structures with thick silicon oxide layers having a thickness in the range of about 2 $\mu$m/kV of applied voltage.

Therefore, there is a need to create thick silicon oxide layers within as on the surfaces of silicon structures. For many semiconductor devices, thickness ranging from greater than 3 up to about 10 $\mu$m are particularly useful.

SUMMARY OF THE INVENTION

One of the embodiments of the invention involves a method of forming a thick silicon oxide layer upon or internal to a silicon structure. This embodiment includes a step of etching a plurality of trenches in or openings through a silicon structure. For example, the etching may be conducted by deep dry silicon etching. With respect to the of the plurality of trenches each trench is separated from an adjacent trench by a trench wall. The silicon is then oxidized. During oxidation the silicon expands. Normally, 1 micrometer of silicon is converted to about 2 $\mu$m of silicon oxide. In other words, during the oxidation process a lateral expansion takes place. The invention takes advantage of this phenomenon. By appropriately selecting the thickness of the walls between trenches and the trench opening width, each trench can be entirely filled with silicon oxide by oxidizing the trench walls. The number of trenches required to oxidize a large area is based on time considerations since the oxidation process is a diffusion limited process. The depth of an oxide layer on a silicon structure surface can be determined by fixing the depth of the trenches (the height of the trench walls). The trench walls will be consumed to form a layer of silicon oxide at the surface of the silicon. Deeper trenches can be etched by increasing the aspect ratio during the etch process.

Another embodiment of the invention, pertains to a method of creating isolation regions within a silicon structure, which isolation regions can withstand high voltages. This embodiment involves etching of a trench or opening of desired shape or shapes into the silicon structure creating an opened shaped portion. If a shape is etched completely through the silicon structure then the shaped portion may be severed from the silicon and drop out. In order to prevent the shaped portion from dropping out, bridges of silicon are maintained across a through-opening at nominal distances during the etching process. The exposed silicon surfaces and the silicon bridges are oxidized. The oxidation causes the silicon to expand, enabling filling of an open space with an oxide layer. The oxide layer separates the shaped portion from the rest of the silicon structure, thus creating a shaped region isolated from the rest of the silicon structure. During the oxidation process, the silicon oxide layer is formed not only in the trenches but also on the surfaces of the silicon. The oxide layer can be etched and removed from areas where it is not desired. Isolation regions of various shapes and sizes can be created using this method.

The present invention also relates to a method of integrating and connecting vertical feedthroughs and of providing vertical interconnects in a stack of silicon structures. This embodiment involves at least two silicon structures. The two structures could be silicon layers within a silicon chip or a wafer, or a stack of silicon chips, or stacks of wafers. Isolation regions can be generated within the silicon structures using the methods described above. Electrical and/or mechanical connections are established through the semiconductor regions in each of the structures. These isolated semiconductor regions can act as feedthroughs for electrical connections which connect different layers within a silicon chip or wafer. Mechanical and electrical connections of stacked chips or wafers can be achieved through fusion bonding, anodic bonding or eutectic processing, for example, but not by way of limitation.

Yet another embodiment of the invention involves a method of creating semiconductor regions of various shapes separated by oxide layers or oxide layers in combination with vacuum which is an excellent insulator. This embodiment involves etching a trench or opening of desired shape or shapes into the silicon structure creating a shaped portion. If a shape is etched completely through the silicon structure, then the shaped portion may be severed from the silicon and drop out. In order to prevent a shaped portion from dropping out, bridges of silicon are maintained across the trench. These bridges give support to the shaped portion. The exposed regions are then oxidized. Once again, the silicon oxide formed expands and fills a portion of the opening or trench. A space is left between the silicon oxide layer covering the shaped portion and the silicon oxide layer covering the surface of the remainder of the silicon structure. A vacuum may be maintained in the space separating two of the oxide layers to provide improved electrical insulation.

BRIEF DESCRIPTION OF THE DRAWINGS

FIGS. 1A through 1D are cross-sectional schematics of a silicon structure showing a series of steps which create a silicon oxide layer on a silicon structure.

FIG. 1A shows a schematic of a cross section of a silicon structure 101.

FIG. 1B shows the FIG. 1A schematic structure after trenches have been etched on its surface.

FIG. 1C shows the FIG. 1B schematic structure after the exposed surfaces have been oxidized.

FIG. 2A shows a schematic of top view of a silicon structure, 200.

FIG. 2B shows the schematic top view of FIG. 2A after through-openings have been etched through silicon structure 200.

FIG. 2C shows the schematic top view of FIG. 2B after exposed surfaces of the structure have been oxidized.

FIG. 2D shows the top view schematic of FIG. 2C after the oxide layer has been removed from the top and bottom surfaces of silicon structure 200.

FIG. 3A a shows a cross-sectional schematic of two silicon structures each having electrical isolation regions.

FIG. 3B shows the FIG. 3A schematic after the two silicon structures has been bonded to create a structure 350.

FIG. 3C shows the FIG. 3B schematic structure 350 after an opening has been formed into the silicon structure, where the opening is available to act as a feedthrough.

FIG. 4A shows a schematic of a silicon structure, 400 having a cylindrical shape etched partially through it from each side, with an unetched area in the center.

FIG. 4B shows the FIG. 4A schematic after the exposed surfaces of the silicon structure has been oxidized.

FIG. 4C shows the FIG. 4B schematic after removal of oxide from the top and bottom surfaces of the structure.

FIG. 5A shows the schematic of a silicon structure, having a cylindrical shape etched through it, with spokes connecting the conductive or semiconductive center region to the conductive or semiconductive exterior structure.

FIG. 5B shows the FIG. 5A schematic after oxidation of exposed surfaces.

FIG. 5C shows the FIG. 5B schematic after the removal of oxide from the top and bottom surfaces of the structure.

DETAILED DESCRIPTION OF THE INVENTION

Figure 2A:
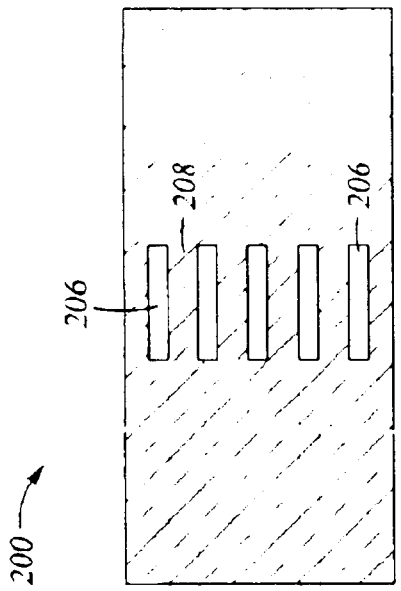
FIGS. 2A–2D show schematics of a series of method steps which create a silicon isolation region in a silicon structure.

As preface to the detailed description, it should be noted that, as used in this specification and the appended claims, the singular forms "a", "an", and "the" include plural referents, unless the context clearly dictates otherwise.

As described above, the present invention pertains to a method of forming thick silicon oxide layers on or inside a silicon-containing structure. Also, the present invention pertains to a method of creating isolation regions within silicon which can withstand high voltages.

FIG. 1A shows a cross sectional schematic of silicon 101 starting structure, 100. FIG. 1B shows the same silicon structure 100 after the etching of trenches 102 into the silicon 101. The trenches 102 are separated by a trench wall 104 which exhibits a height, h,108, and a trench opening width, w, 106. The trenches can be etched by providing a masking pattern on the surface of the silicon structure 100, using techniques known in the art, and then conducting plasma etching or wet etching of the silicon through the mask using known etch techniques. Known plasma etching techniques enable the etching deep trenches having an aspect ratio as high as 50:1. If the trench is to be entirely filled with silicon oxide, the trench opening width 106 of trench 102 should be two times the trench wall thickness 105 of wall 104.

FIG. 1C shows the same silicon structure 100 after oxidation of the surfaces of FIG. 1B. A silicon oxide layer 112 has formed on the upper surface 103 of silicon structure 100. A thin silicon oxide layer 113 forms on other exposed surfaces as well. The trench opening width may be such that the entire trench will not be filled during the oxidation, if it is desired to form conduits between isolation areas. The trench wall thickness 105 of trench walls 104 is limited by the time available for carrying out the oxidation process. Typically the oxidation is thermal oxidation, as this provides a non-contaminated oxide. In the case of a typical wet thermal oxide formation, at 1100° C., a 2 micrometer wall thickness requires about 8 hours for conversion to 4 micrometers of silicon oxide, by way of example and not by way of limitation.

Patterning of the silicon structure prior to oxidation is carried out so that thick oxide layers are formed only at intended surfaces. By this process it is possible to obtain a thick oxide layer, which is about 20 to 50 times thicker than what is possible using other fabrication methods. Unwanted thin oxide layers may be removed from desired surfaces by masking surfaces which are not to be etched, and dipping the structure in 10% buffered hydrofluoric acid solution.

The mechanical stress caused by the formation of thermal oxide depends on the patterned structure, the thickness of walls converted to oxide and other factors. The mechanical stress thus created can be released using a variety of techniques. Some of the suggested examples are stress release structures built into the silicon structure itself. Double sided structuring of a wafer is another means to compensate for the mechanical stress caused across the wafer by the thermal oxide formation. By oxidizing both sides of a wafer the stress created on one side may be balanced by the stress on the other side.

Figure 2B:
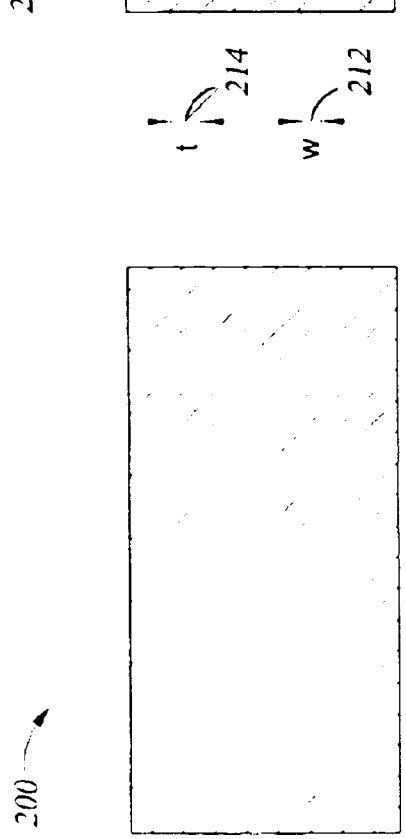

FIG. 2A, shows another embodiment of the invention which may be used to provide electrical isolation in a silicon substrate. FIG. 2A shows a schematic of top view of silicon structure 200. This embodiment of the invention involves a method of creating isolation regions within the structure 200. FIG. 2B shows a schematic top view of the FIG. 2A after openings 206 have been etched all the way through the silicon structure, 200 at nominal distance apart. Openings 206 are separated by walls, 208. The openings 206 have a width w, represented by the numeral 212 and walls 208 have a thickness t, represented by the numeral 214.

Figure 2C:
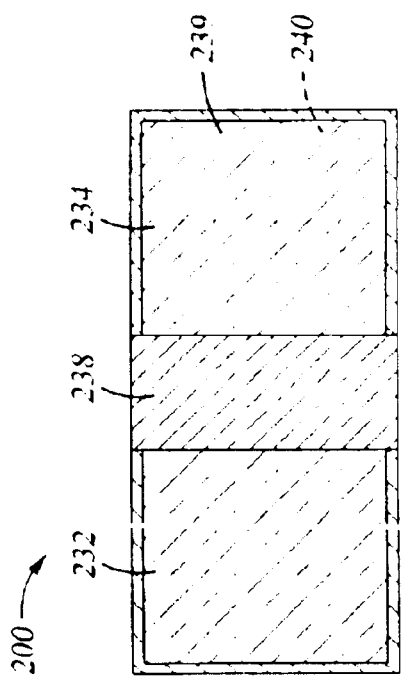
Figure 2D:
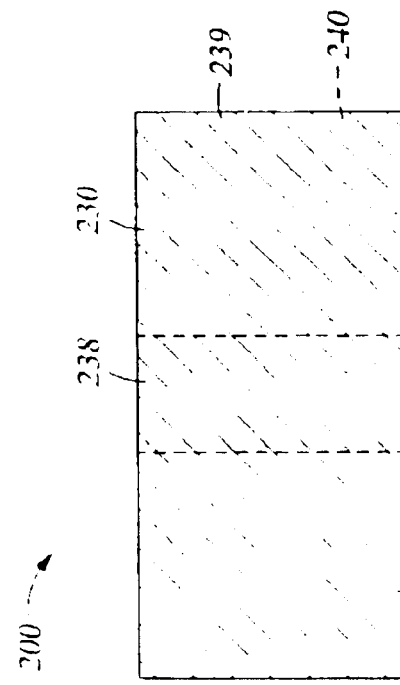

FIG. 2C, shows the FIG. 2B structure after the exposed surface of the silicon is oxidized. Silicon oxide layers are formed during the oxidation. A thin silicon oxide layer 230 covers the entire silicon structure 200. A thick silicon oxide layer 238 forms through the area which was etched to form openings 206, creating two electrically isolated silicon regions 232, and 234. During oxidation, the walls 208 are oxidized and expand laterally to form one continuous silicon oxide layer 238. FIG. 2D shows the schematic top view of the FIG. 2C structure after oxide layer 230 is removed from at least upper surface 239 and lower surface 240 of processed structure 200. These surfaces 239 and 240 are typically lapped and polished to provide access to the underlying silicon. The silicon oxide layer 230 may be removed from all sides if desired. The thick silicon oxide layer 238, separates the two electrically isolated silicon regions 232 and 234. Patterning of the silicon structure prior to oxidation is carried out in a manner such that the thick oxide layers form only on intended surfaces. Various anodisation processes as well as thermal oxidation may be used to grow thick oxide layers.

Figure 3A:
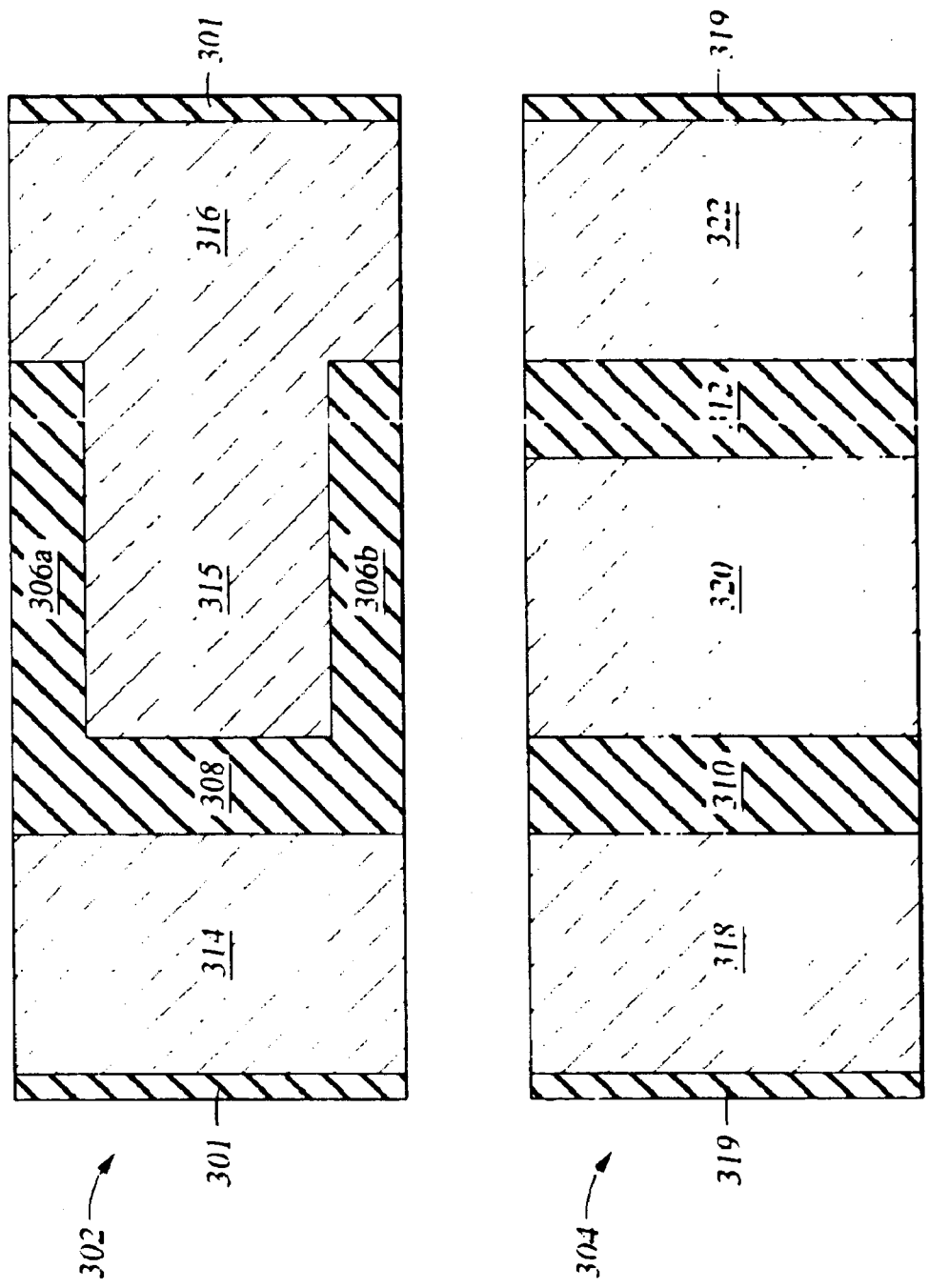
FIGS. 3A through 3C show another embodiment of the invention where a series of method steps provide electrical isolation in a silicon substrate.
Figure 3B:
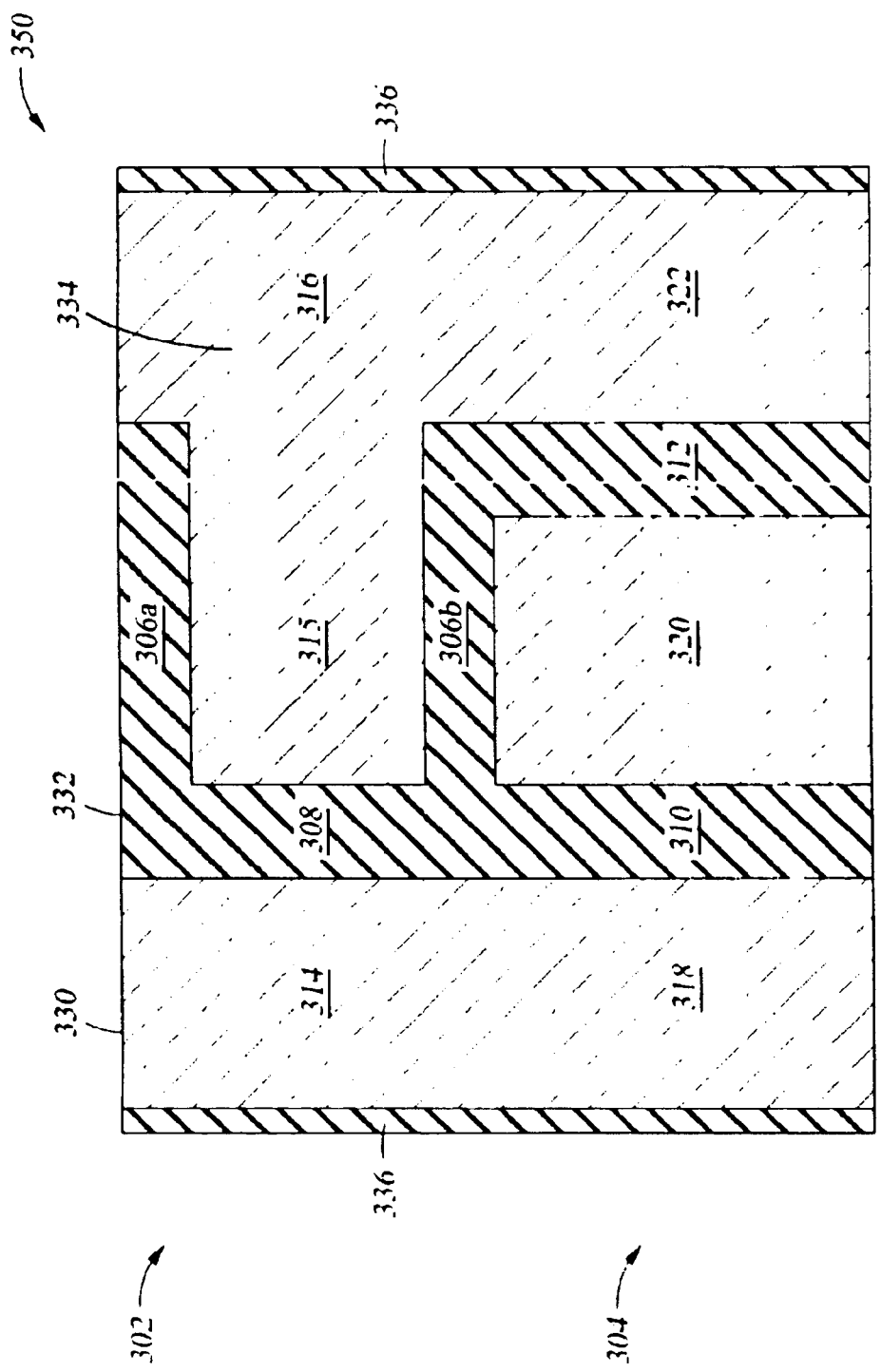
Figure 3C:
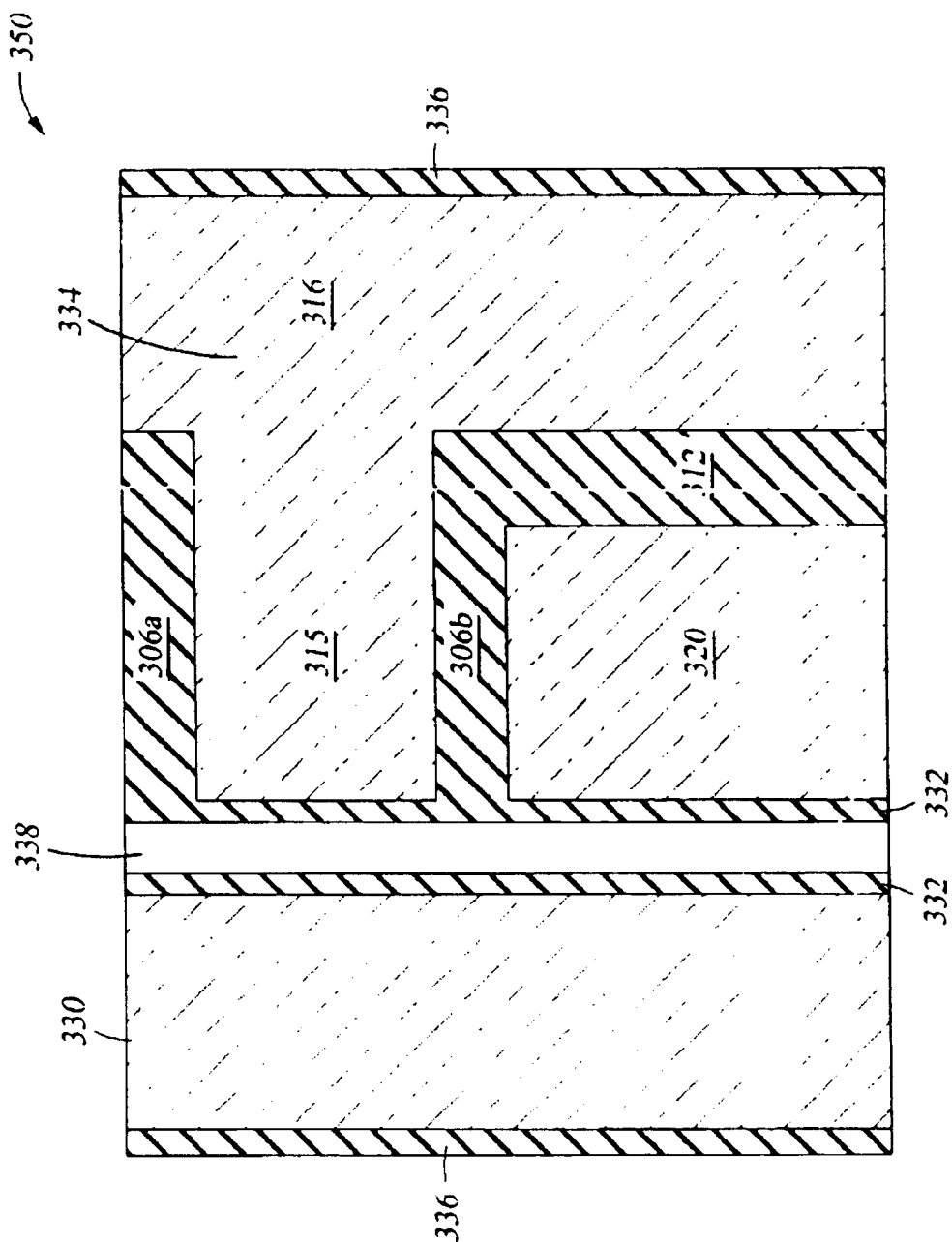

Another embodiment of the invention pertains to a method of integrating and connecting vertical feedthroughs and providing vertical interconnects in a stack of silicon structures. FIGS. 3A–3C illustrate the various steps involved in such a method. FIG. 3A shows a schematic side view of two silicon structures 302 and 304, which are bonded together during device fabrication. Both ends of the silicon structures 302 and 304 are covered by thin silicon oxide layers 301 and 319 respectively. Structure 302 contains semiconductor regions 314, 315 and 316. Adjoining semiconductor regions 314 and 315 are separated by a silicon oxide region 308, which acts as an electrical isolation region. The semiconductor region, 315 is also bounded by silicon oxide isolation layers, 306a on the top and 306b on the bottom. Structure 304 contains semiconductor regions 318, 320, and 322. Semiconductor regions 318 and 320 are separated from one another by a silicon oxide electrical isolation layer 310. The semiconductor regions 320 and 322 are separated from one another by a silicon oxide electrical isolation layer 312.

FIG. 3B shows the structures of FIG. 3A after bonding. Here the semiconductor regions 314 and 318 are combined to form the semiconductor region 330. The regions 315, 316 and 322 are combined to form the semiconductor region 334. The region 320 remains in electrical isolation from the other semiconductor regions by the silicon oxide layers 308/310 306b, and 312. The two structures can be bonded through various processes, for example, fusion bonding, or eutectic processing. With reference to FIG. 3A, the thick oxide layers 306a and 306b on the surfaces of the structure 302 are created using the method described in FIGS. 1A through 1D. The thick oxide layer 308 through structure 302, and the thick oxide layers 310 and 312 through structure 304 are created using the method described with reference to FIGS. 2A, through 2D. The structures 302, and 304 could be two layers within a silicon chip, could be two wafers or could be present within a stack of silicon chips or stacks of wafers.

The two structures 302 and 304 are bonded together using methods described above. The structures 302 and 304 are aligned and bonded together as shown in FIG. 3B, establishing connections between semiconductor regions 314 and 318, and also between semiconductor regions 316 and 322. The bonded semiconductor regions act as interconnects which are electrically isolated by bonded thick silicon oxide layers 308/310 and 306b/312. The bonded semiconductor regions 314, and 318 may be used as an electrical connector to a chip carrier. As can be seen in FIG. 3B, the bonded structure will provide a high voltage isolation between the areas 314/318, 320 and 315/316/322.

FIG. 3C shows the FIG. 3B structure after an opening 338 is formed vertically through the thick oxide layer 332. The opening 338, created through the silicon oxide layer 332, acts as a vertical feedthrough for a conductive interconnect (not shown). The opening 338 can be used to feed wires or other connectors to other structures (not shown). In one embodiment, a metal coating could be deposited inside opening, 338.

Figure 4A:
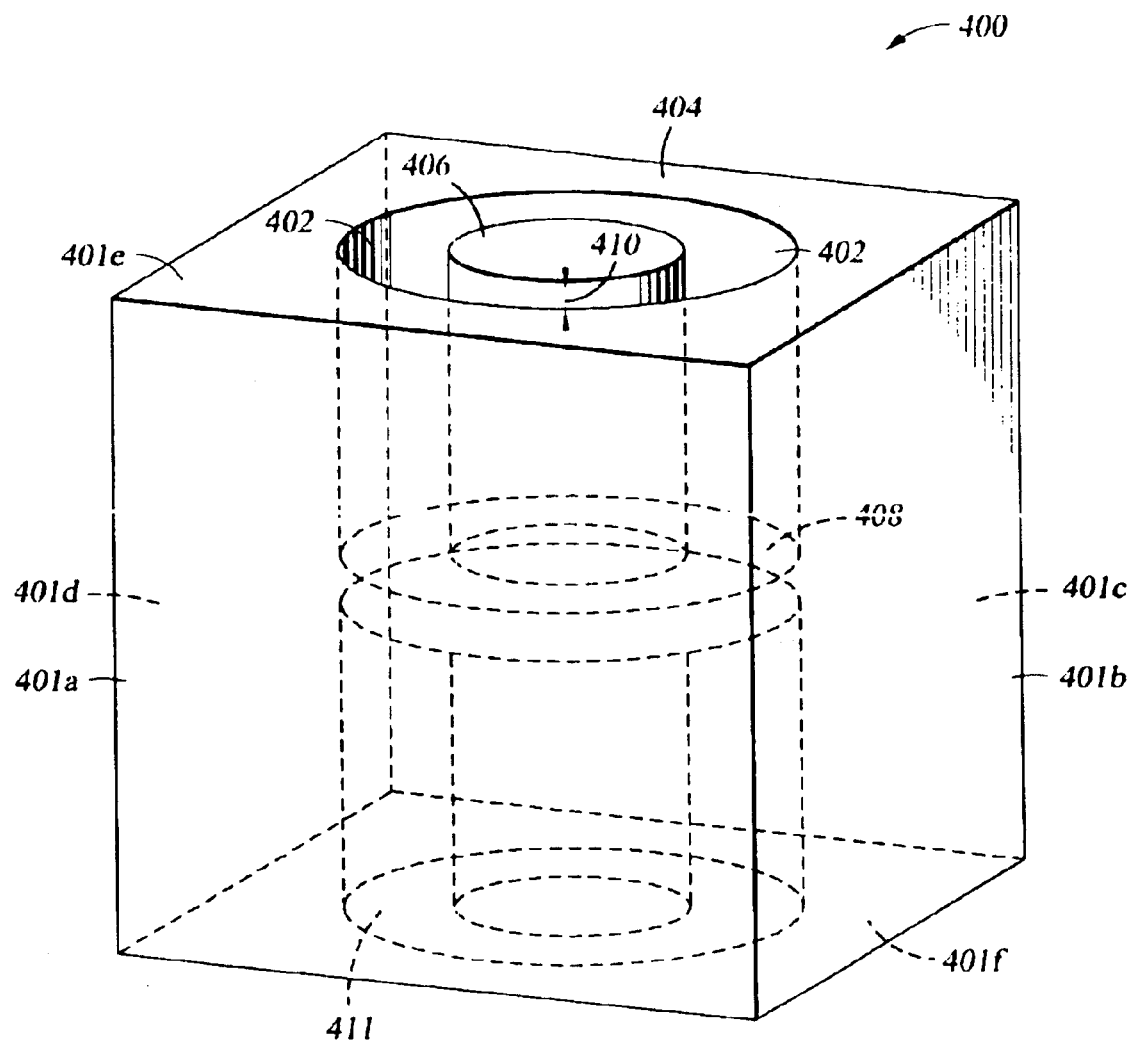
FIGS. 4A through 4C show an embodiment of the invention where a series of method steps provide electrical isolation of a conductive center region from an exterior structure.

Conductive or semiconductive structures electrically isolated by isolation regions of different shapes can be made using the above described techniques. A semiconductive structure can be made more conductive by the addition of dopants where required FIGS. 4A, through 4C illustrate, by way of example, the generation of a cylindrical isolation region through a silicon structure 400, where a conductive or semiconductive cylindricall region, 406 is isolated from a surrounding conductive or semiconductive region 404 by a thick oxide layer. Silicon structure 400 includes a front surface 401a, a back surface 401c, a first side surface 401b, a second side surface 401d, a top surface 401e, and a bottom surface 401f. A cylindrical through-opening 402 is etched through the silicon structure 400. The cylindrical through-opening 402 separates the conductive cylindrical region 406 from the surrounding conductive region 404. To maintain conductive cylindrical region 406 in place in structure 400 during processing, the through-opening 402 is etched partway through structure 400 from top surface 401e and partway through from the bottom surface 401f, leaving a disk of silicon 408 of nominal thickness bridging conductive cylindrical region 406 to the surrounding conductive region 404.

Figure 4B:
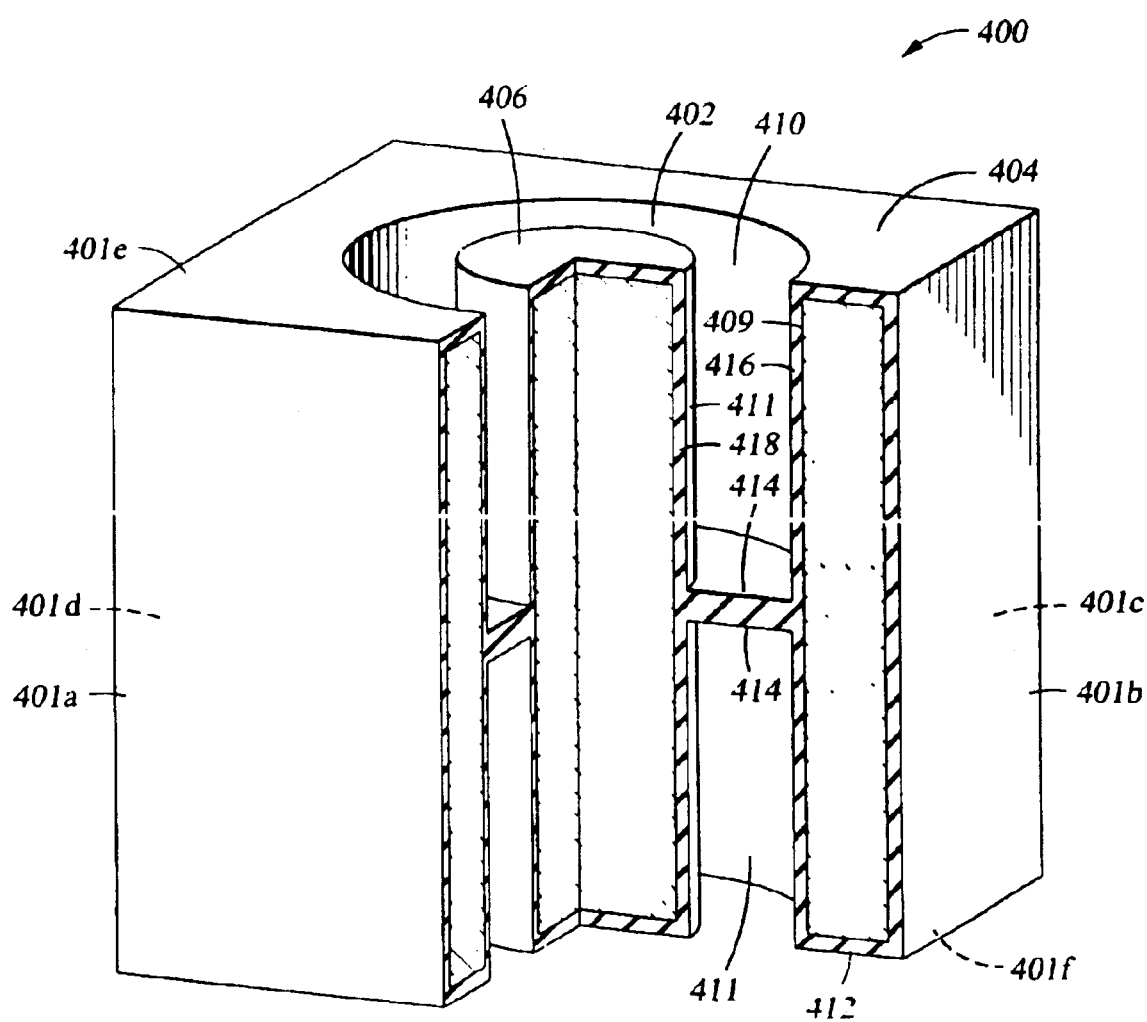
Figure 4C:
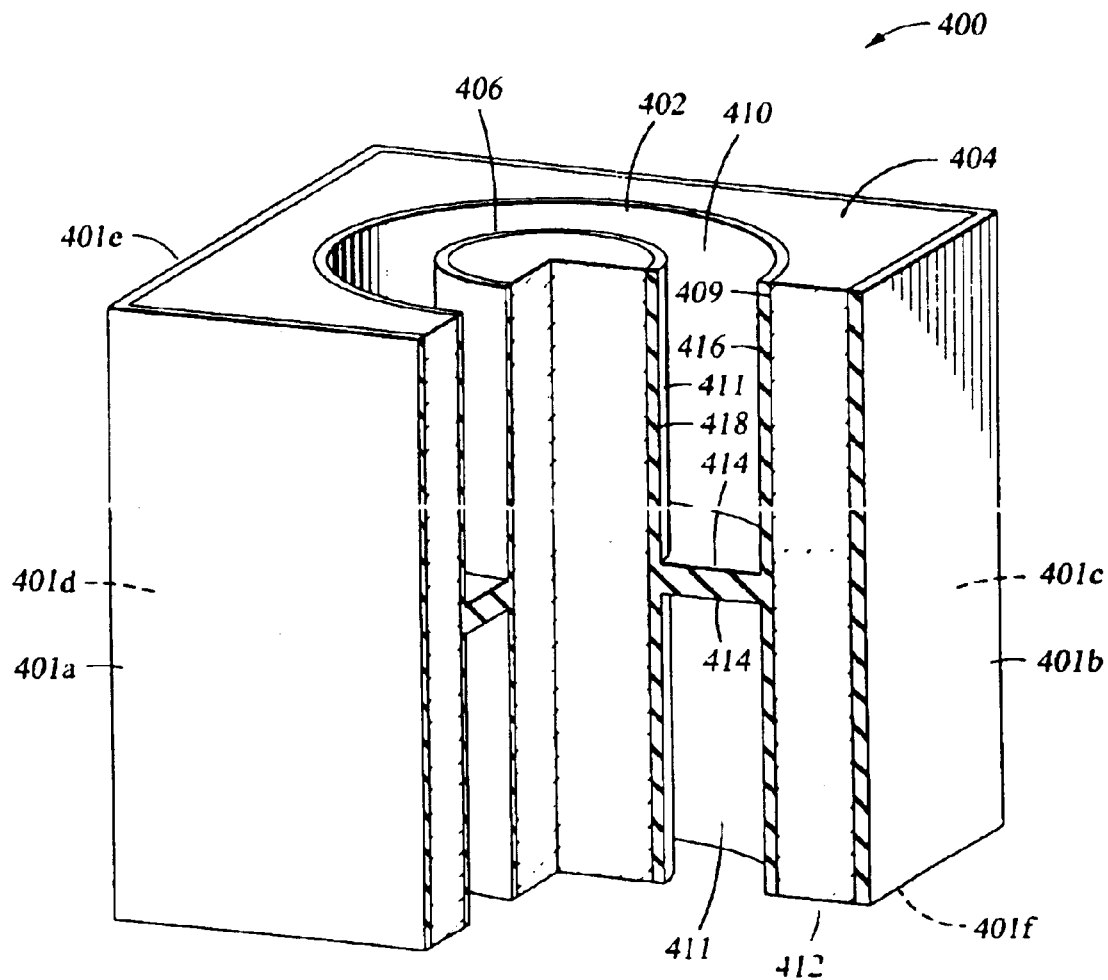

FIG. 4B shows the FIG. 4A structure after thermal oxidation. A layer of silicon oxide 412 is formed over exterior surfaces 401a–401f of structure 400. An oxide layer 416 is formed on the interior surface 409 of the through-opening 402, and an oxide layer 418 is formed on the exterior surface, 411 of cylindrical region 406. The silicon disc 408 has been oxidized to form an oxide layer 414 in the through opening 402. Thickness of the disc 408 is typically selected so that it will be entirely converted to an oxide during the oxidation process.

The cylindrical region 406 is electrically isolated from surrounding region 404 by a combination of silicon oxide layers 416, 418, and 414, and by the air or vacuum space adjacent these oxide layers. Depending on the distance between these areas, the maximum breakdown voltage can be in the kilovolts range. The disk 408 can also act as a separation wall between two areas of structure 400 which are exposed to different pressures. For example an open space within area 410 may be at a given pressure while the open space within area 411 is under vacuum. It is understood that the shape of the isolation regions can be any shape and need not be cylindrical.

FIG. 4C shows a schematic of the silicon structure in FIG. 4B after that the structure has been lapped and polished and the oxide layer 412 present on the exterior wall surfaces 401e and 401f of structure 400 has been removed. It is understood that the layer 412 could be retained on any of the surfaces if desired. The space between the two oxide layers 416 and 418 may be filled with silicon oxide by CVD deposition if necessary, using techniques known in the art.

Figure 5A:
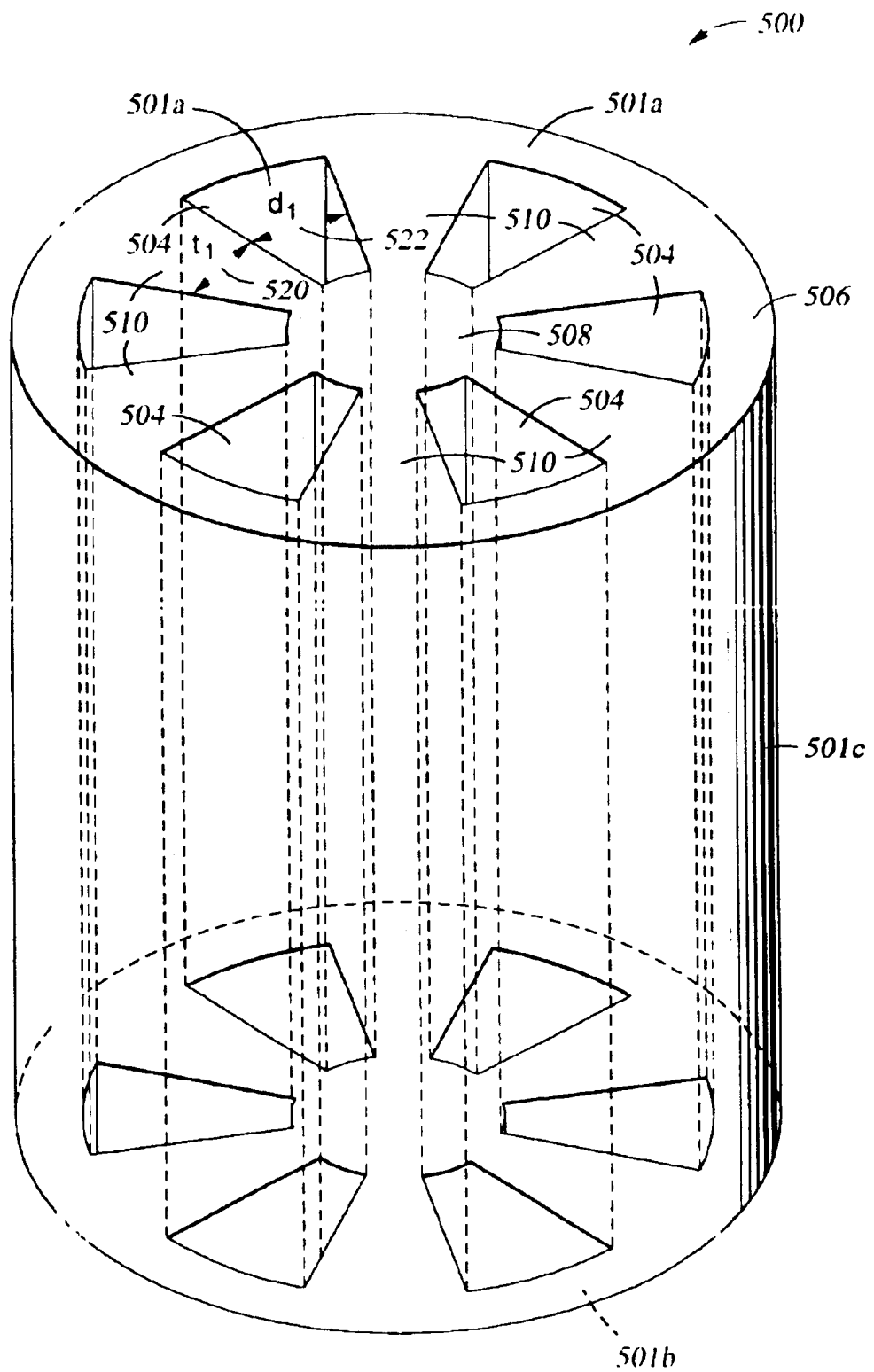
FIGS. 5A through 5C shows another embodiment of the invention where a series of method steps provide electrical isolation of a conductive center region from an exterior structure.
Figure 5B:
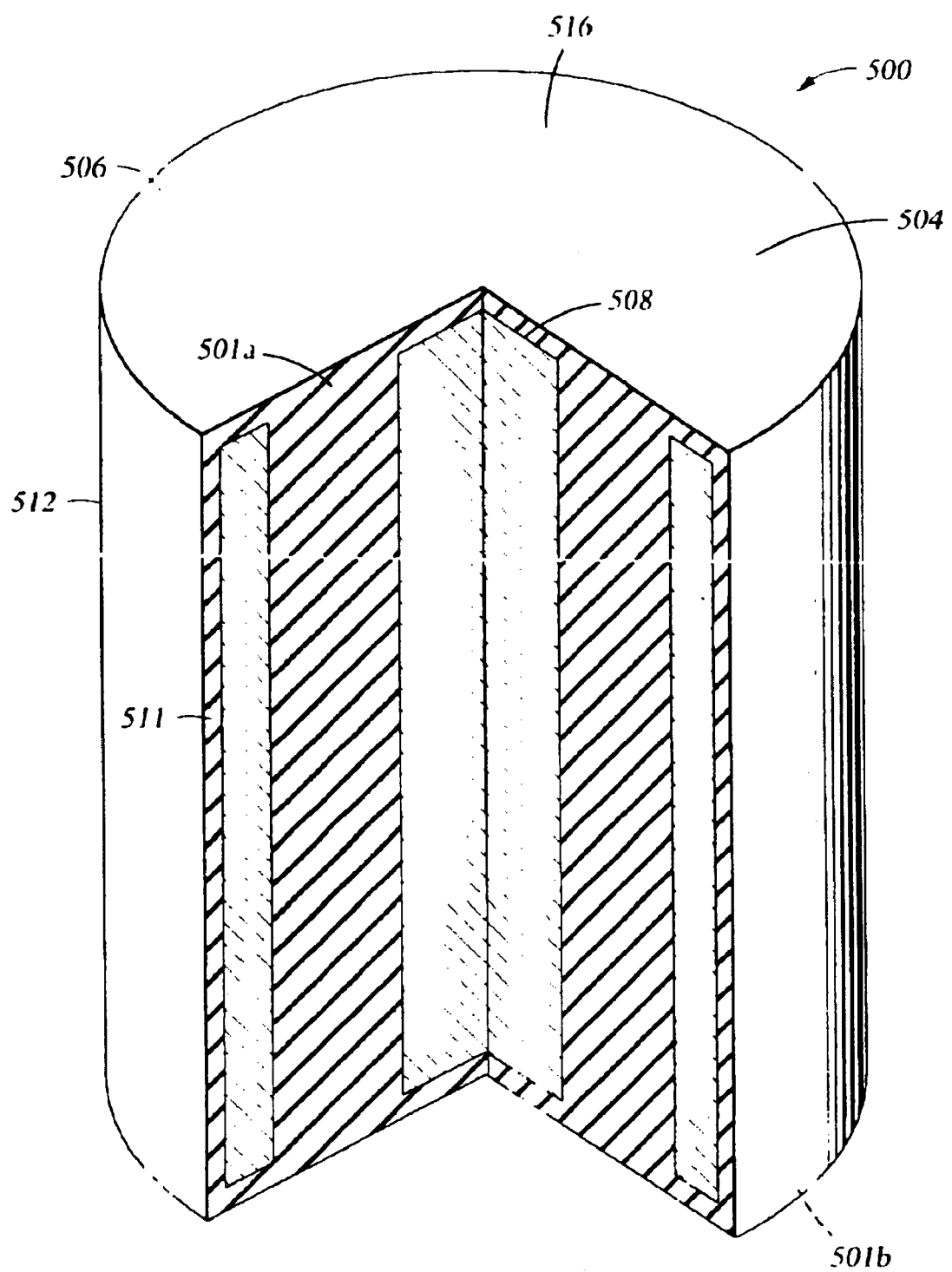
Figure 5C:
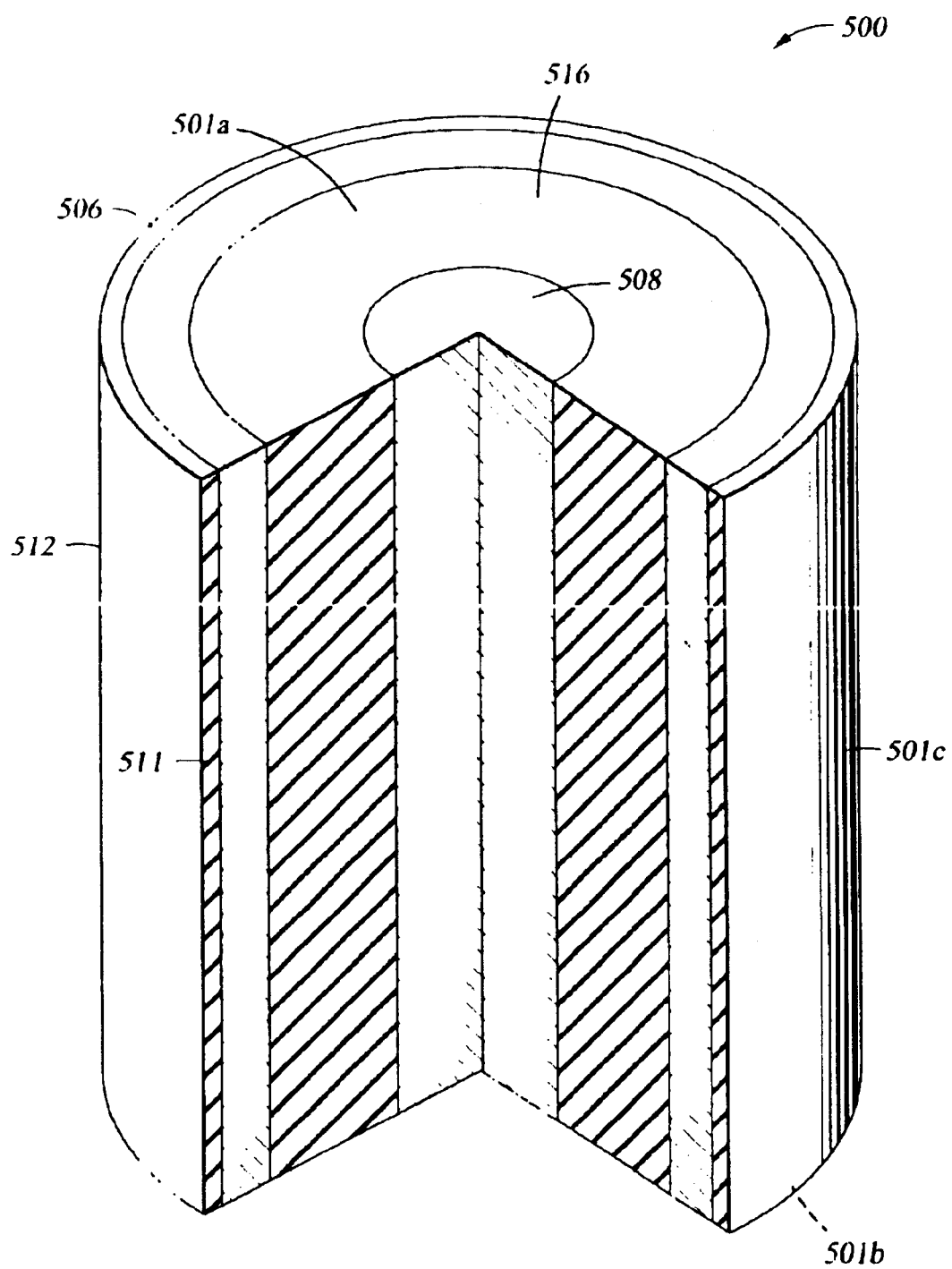

FIGS. 5A–5C show an alternative method of providing electrical isolation for a structure similar to the kind shown in FIGS. 4A–4C. FIG. 5A shows a cylindrical silicon structure 500 including a top surface 501a, a bottom surface 501b and an outer surface 501c. The cylindrical silicon structure 500 also includes an internal silicon-containing conductive or semiconductive cylinder 508 and an external silicon-containing conductive or semiconductive cylinder 506. The internal cylinder 508 was created by etching multiple open spaces 504 to form a cylinder shape within structure 500. Between these open spaces 504 are spokes 510 of the silicon-containing conductive or semiconductive material. In the present embodiment external cylinder 506, cylinder 508 and spokes 510 are silicon. The spokes 510 in this embodiment exhibit a thickness $t_1$ while the open spaces extend for a horizontal distance $d_1$. The relationship between $t_1$ and $d_1$ is such that $d_1=2\times t_1$, so that upon oxidation of spokes 510, and the surfaces of spaces 504, spaces 504 will be filled with silicon oxide. The number of spokes and open spaces required for a given structure 500 can be calculated by one skilled in the art, depending on the amount of process time available for thermal oxidation and the time required under oxidation conditions to convert the silicon to silicon oxide. With respect to wet thermal oxidation, at about 1150° C., typically about 24 hours are required to oxidize a silicon spoke which is about 4 µm thick.

FIG. 5B shows the same structure 500 after the exposed surfaces of the structure 500 have been oxidized. Oxide cylinder 516 formed from oxidized spokes 510 electrically isolates internal silicon cylinder 508 from external silicon cylinder 506. This embodiment of the invention allows cylindrical structure 500 to be etched all the way through in one direction, to produce internal silicon cylinder 508, and external silicon cylinder 506, with spokes 510 holding the internal silicon cylinder 508 in place. This provides the advantage that only one side of the cylindrical structure 500 has to be masked during the etch process and only a single etch step needs to be carried out.

The spoke thickness, $t_1$ and the distance $d_1$ may be selected such that the entire open space 504 shown in FIG. 5A is not filled during the oxidation. In such cases, vacuum may be maintained in any remaining areas. Also, in such instances where thermal oxidation is impractical for filling the open space 504 the remaining open space may be filled with CVD-deposited silicon oxide, if desired. FIG. 5C shows the schematic of the silicon structure in FIG. 5B after the structure has been lapped and polished to remove the oxide layer, 512 from the top surface 501a and bottom surface 501b.

The above described preferred embodiments are not intended to limit the scope of the present invention, as one skilled in the art can, in view of the present disclosure expand such embodiments to correspond with the subject matter of the invention claimed below.

I claim:

1. A method of forming a silicon oxide layer having a thickness ranging from about 3 µm to about 200 µm in a silicon containing structure, said method comprising:

a) etching a silicon layer to produce a plurality of adjacent trenches separated by a plurality of trench walls, said etched silicon layer including trenches having a nominal trench opening width and a nominal trench height, and trench walls of nominal wall thickness, where said nominal trench opening width is about 2 times said nominal trench wall thickness within said silicon layer; and b) thermally oxidizing said plurality of trench walls within said silicon layer, whereby a thermally oxidized silicon oxide layer having a thickness approximately equal to said trench height and a width or length which is greater than the sum of said trench opening widths is produced.

2. The method according to claim 1, wherein said method includes an additional step:
   c) selectively removing silicon oxide from at least one exterior surface of said silicon containing structure.

3. The method according to claim 1, wherein said nominal thickness of said thickness of said trench wall is consumed during said thermal oxidation to provide silicon oxide.

4. The method according to claim 3, wherein said nominal wall thickness is less than 4 μm.

5. The method according to claim 1, wherein said trench openings are formed by plasma etching.

6. The method according to claim 5, wherein said plasma etching is reactive ion etching.

7. The method according to claim 6, wherein said reactive ion etching is anisotropic etching using a fluorine-containing etchant component.

8. The method according to claim 7, wherein said etching produces a trench having essentially vertical sidewalls.

9. The method according to claim 6, wherein an aspect ratio of said nominal trench height to said trench opening width ranges from about 1:1 to about 50:1.

10. The method according to claim 9, wherein said aspect ratio is less than about 50:1.

11. A method of forming an electrically isolating region in a silicon containing structure comprising:
    etching a plurality of openings, each opening having a nominal height and separated by a nominal distance in a silicon-containing layer; and
    thermally oxidizing said silicon structure, to provide at least one thermally oxidized silicon oxide area extending from an interior of each opening outward through a nominal distance into said silicon layer, where a thickness of said silicon oxide area is at least equal to a height of an opening which is part of said plurality of openings, and wherein said height is at least 3 μm.

12. The method according to claim 11, wherein said opening extends only partly through a silicon-containing layer in said silicon-containing structure or extends only partly through said silicon-containing structure.

13. The method according to claim 11, wherein said opening extends completely through a silicon-containing layer in said silicon-containing structure or extends completely through said silicon-containing structure.

14. The method according to claim 13, wherein a portion of said silicon-containing layer or said silicon-containing structure is connected to another portion of said silicon-containing layer or silicon containing structure respectively, by at least one silicon bridge.

15. A method of forming a shaped electrically isolated region in a silicon structure comprising:
    etching at least one first opening a nominal distance into a first side of said silicon structure;
    etching at least one second opening a nominal distance into a second side of said silicon structure, which second side is directly opposed to said first side of said silicon structure; and
    thermally oxidizing said silicon structure, to provide a thermally oxidized silicon oxide layer having a thickness approximately equal to the sum of the first nominal distance and said second nominal distance.

16. The method according to claim 15, wherein silicon oxide formed on at least one exterior surface is selectively removed by plasma etching.

17. The method according to claim 15, wherein silicon oxide formed on at least one exterior surface is selectively removed by lapping or polishing.

18. The method according to claim 15, wherein unetched silicon forms a silicon bridge between said first opening and said second opening.

19. The method according to claim 18, wherein said silicon bridge between said first opening and said second opening is about 4 μm or less in thickness.

20. A method of forming an isolating interconnect through-opening within a multi-layered silicon structure comprising:
    a) etching a silicon layer to produce a plurality of adjacent openings which pass completely through said silicon layer, where said openings are separated by a plurality of silicon walls which also pass completely through said silicon layer;
    b) thermally oxidizing said silicon layer, creating at least one oxidized region which replaces said openings, so that said oxidized region passes completely through said silicon layer;
    c) selectively removing silicon oxide from an exterior surface of said oxidized silicon layer to expose underlying silicon where present;
    d) bonding a plurality of silicon layers produced in the manner described in steps a) through c), to provide at least one continuous oxidized region through said bonded multi-layered silicon structure; and
    e) creating a through opening through said continuous oxidized region in a manner such that said oxidized region provides an isolated interconnect through said multi-layered silicon structure.

21. The method according to claim 20, wherein said bonding is fusion bonding.

22. The method according to claim 20, wherein said bonding is via eutectic processing.

23. The method according to claim 20, wherein said multi-layered silicon structure includes stress release elements.

24. The method according to claim 20, including an additional step f) in which oxidized silicon is removed from exterior surfaces of said multi-layered silicon structure subsequent to said bonding.

25. The method according to claim 20, wherein a conductive material is applied over or passed through said through-opening.

26. The method according to claim 25, wherein said through-opening is coated with a conductor.

27. A method of creating isolation regions in a silicon structure comprising:
    etching a plurality of openings through said silicon structure, creating a shaped portion separated by spokes between said plurality of openings; and
    thermally oxidizing said silicon structure, wherein said spokes are converted to silicon oxide which at least partially fills said etched openings, whereby said shaped portion of said silicon structure contains silicon oxide regions having a thickness equal to the length of said spokes.

28. The method according to claim 27, wherein silicon oxide is removed from at least one exterior surface of said silicon structure.

29. The method according to claim 27, wherein said openings are completely filled with silicon oxide.

30. The method according to claim 29, wherein said spokes exhibit a thickness of about 4 μm or less.

* * * * *